United States Patent
Hu et al.

(10) Patent No.: US 9,871,171 B2
(45) Date of Patent: Jan. 16, 2018

(54) LIGHT-EMITTING DEVICE AND MANUFACTURING METHOD THEREOF

(71) Applicant: EPISTAR CORPORATION, Hsinchu (TW)

(72) Inventors: Jen-Li Hu, Hsinchu (TW); Tzu-Chieh Hsu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 33 days.

(21) Appl. No.: 14/535,995

(22) Filed: Nov. 7, 2014

(65) Prior Publication Data

US 2016/0133796 A1 May 12, 2016

(51) Int. Cl.
*H01L 33/00* (2010.01)
*H01L 33/46* (2010.01)
*H01L 33/42* (2010.01)
*H01L 33/38* (2010.01)
*H01L 33/14* (2010.01)
*H01L 33/40* (2010.01)

(52) U.S. Cl.
CPC .............. *H01L 33/46* (2013.01); *H01L 33/14* (2013.01); *H01L 33/145* (2013.01); *H01L 33/38* (2013.01); *H01L 33/405* (2013.01); *H01L 33/42* (2013.01)

(58) Field of Classification Search
CPC ......... H01L 33/38; H01L 33/42; H01L 33/46; H01L 33/14; H01L 33/145
See application file for complete search history.

(56) References Cited

U.S. PATENT DOCUMENTS

| | | | | |
|---|---|---|---|---|
| 5,571,391 | A * | 11/1996 | Teraguchi | H01L 29/452 257/615 |
| 8,474,233 | B2 * | 7/2013 | Chen | H01L 33/46 257/13 |
| 8,766,297 | B2 * | 7/2014 | Ito | H01L 33/145 257/98 |
| 2005/0017250 | A1 * | 1/2005 | Nitta | H01L 33/16 257/79 |
| 2012/0080697 | A1 * | 4/2012 | Chen | H01L 27/15 257/91 |
| 2013/0214294 | A1 * | 8/2013 | Yang | H01L 33/0095 257/88 |

(Continued)

OTHER PUBLICATIONS

Eugene Hecht "Optics" p. 137. Published by Pearson Education in 2008.*

(Continued)

*Primary Examiner* — Jesse Y Miyoshi
*Assistant Examiner* — Tuan A Hoang
(74) *Attorney, Agent, or Firm* — Ditthavong & Steiner, P.C.

(57) ABSTRACT

A light-emitting device comprises a light-emitting structure capable of emitting a light; an electrode formed on a side of the light-emitting structure; a transparent structure formed on a second side of the light-emitting structure, wherein the transparent structure is aligned to a region of the electrode, and comprises a first transparent layer and a second transparent layer around the first transparent layer; a contact structure formed on the second side of the light-emitting structure; and a reflective layer covering the transparent structure and the contact structure.

20 Claims, 4 Drawing Sheets

(56) References Cited

U.S. PATENT DOCUMENTS

2015/0076547 A1* 3/2015 Totani .................. H01L 33/145
257/98

OTHER PUBLICATIONS

DuPont FEP Fluorocarbon Film—Properties Bulletin. Published by DuPont in 2010.*
Kim et al. "Formation and Behavior of Kirkendall voids within intermetallic layers of solder joints" in Journal of Materials Science: Material Electronics vol. 22, pp. 703-716. Published by Springer in 2011.*
Eugene Hecht "Optics", p. 137. Published by Pearson Education in 2008.*

* cited by examiner

LIGHT-EMITTING DEVICE AND MANUFACTURING METHOD THEREOF

TECHNICAL FIELD

The disclosure relates to a light-emitting device, and more particularly, to a light-emitting device comprising a light-emitting structure and a transparent structure formed on the light-emitting structure, and the manufacturing method thereof.

DESCRIPTION OF BACKGROUND ART

Light-emitting diode (LED) is widely used as a solid state light source. Light-emitting diode (LED) generally comprises a p-type semiconductor layer, an n-type semiconductor layer, and an active layer between the p-type semiconductor layer and the n-type semiconductor layer for emitting light. The material of the LED generally comprises group III-V compound semiconductor such as gallium phosphide, gallium arsenide, or gallium nitride. The principle of the LED is to transform electrical energy to optical energy by applying electrical current to the LED and injecting electrons and holes to the active layer. The combination of electrons and holes in the active layer emits light accordingly.

SUMMARY OF THE DISCLOSURE

A light-emitting device comprises a light-emitting structure capable of emitting a light; an electrode formed on a first side of the light-emitting structure; a transparent structure formed on a second side of the light-emitting structure, wherein the transparent structure is aligned to a region of the electrode, and comprises a first transparent layer and a second transparent layer around the first transparent layer; a contact structure formed on the second side of the light-emitting structure; and a reflective layer covering the transparent structure and the contact structure.

DETAILED DESCRIPTION OF THE PRESENT DISCLOSURE

Figure 1:
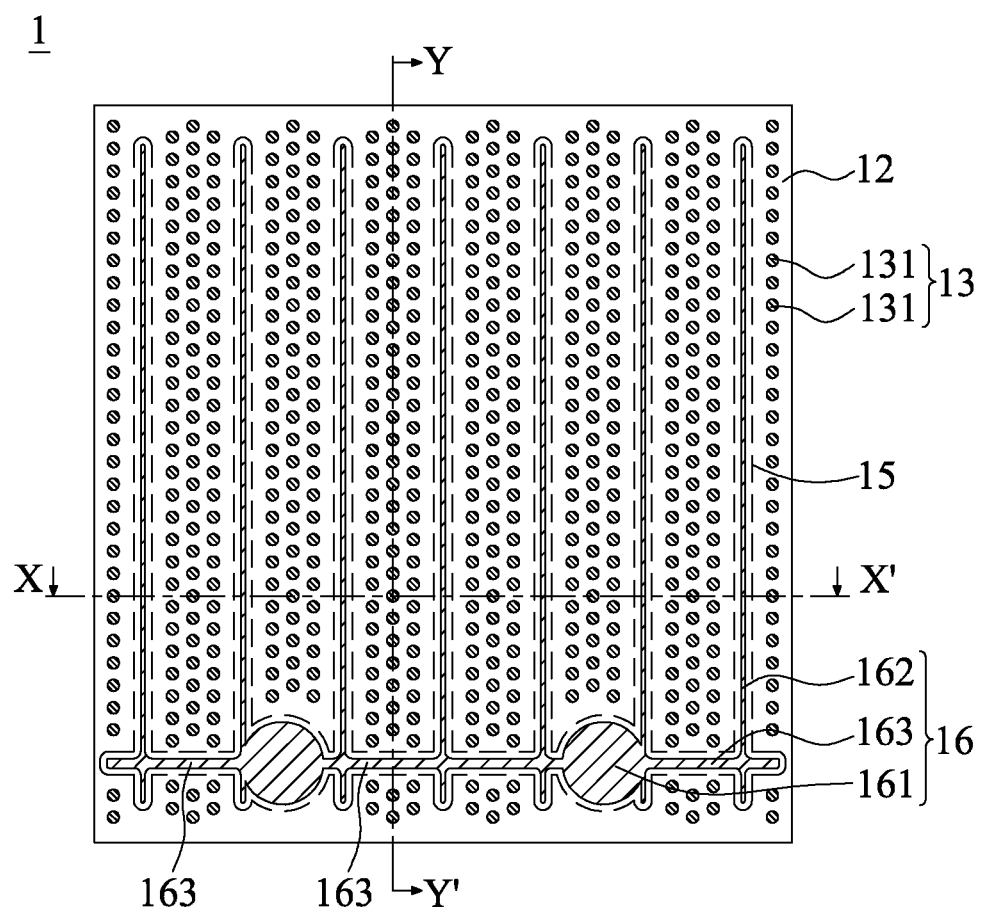
FIG. 1 shows a top view of a light-emitting device in accordance with a first embodiment of the present disclosure.
Figure 2:
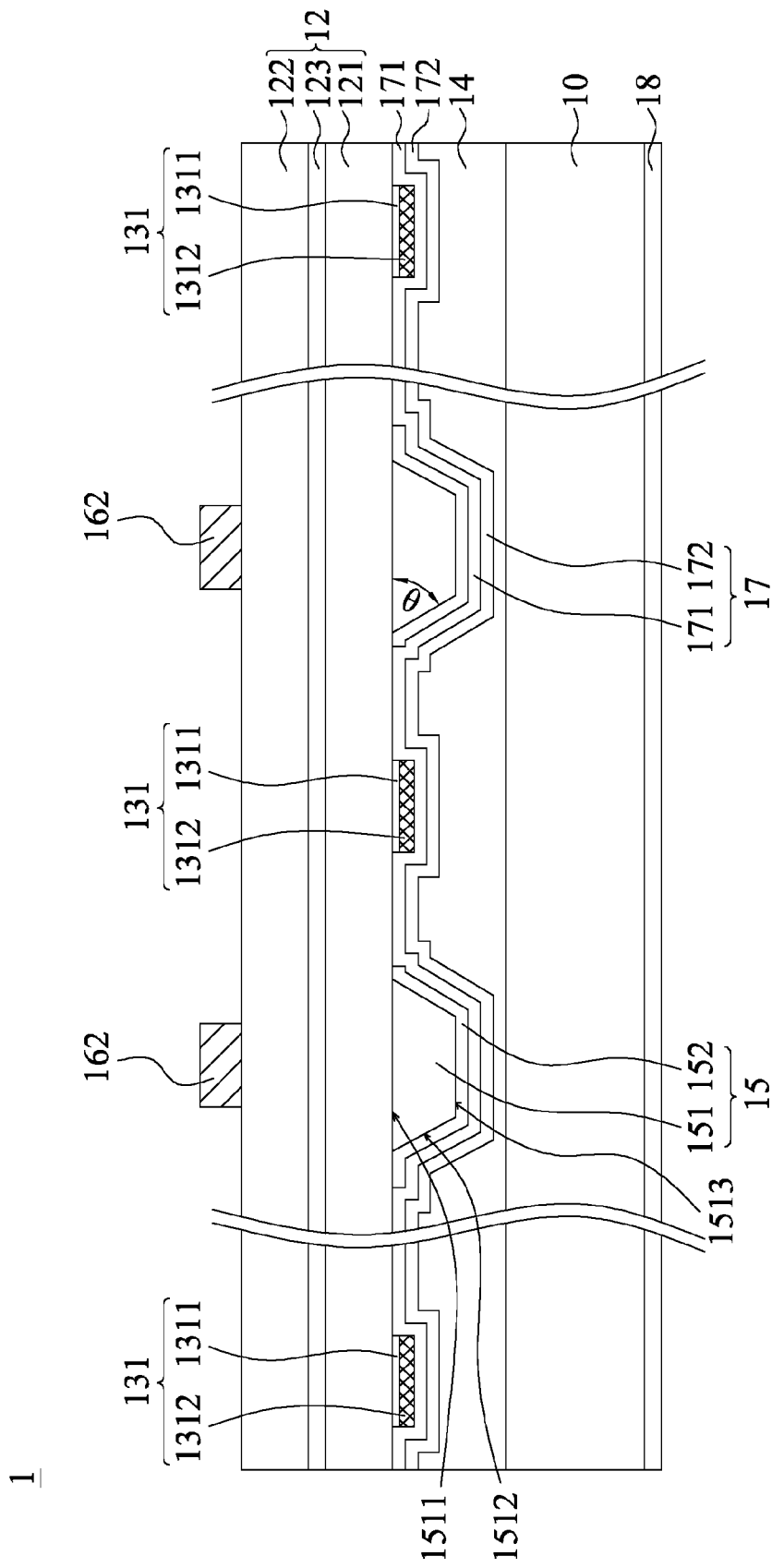
FIG. 2 shows a cross-sectional view of a light-emitting device along line X-X' of FIG. 1.

FIG. 1 shows a top view of a light-emitting device 1 in accordance with a first embodiment of the present disclosure. FIG. 2 shows a cross-sectional view of the light-emitting device 1 along line X-X' of FIG. 1. The light-emitting device 1, being a light-emitting diode (LED), comprises a light-emitting structure 12 epitaxially deposited on a growth substrate (not shown) by a known epitaxy method, such as metallic-organic chemical vapor deposition (MOCVD) method, molecular beam epitaxy (MBE) method, or hydride vapor phase epitaxy (HVPE) method. The light-emitting structure 12 comprises a first semiconductor layer 121 having a first conductivity type, a second semiconductor layer 122 having a second conductivity type different from the first conductivity type, and an active layer 123 formed between the first semiconductor layer 121 and the second semiconductor layer 122. The active layer 123 comprises a single heterostructure (SH), a double heterostructure (DH), or a multi-quantum well (MQW) structure. In one embodiment, the first semiconductor layer 121 is an n-type semiconductor layer for providing electrons, the second semiconductor layer 122 is a p-type semiconductor layer for providing holes, and holes and electrons combines in the active layer 123 to emit light under an external driving current. The material of the active layer 123 comprises $In_xGa_yAl_{1-x-y}N$ for emitting light having a dominant wavelength in the ultraviolet to green spectral regions, $In_xGa_yAl_{1-x-y}P$ for emitting light having a dominant wavelength in the yellow to red spectral regions, or $In_xGa_yAl_{1-x-y}As$ for emitting light having a dominant wavelength in the infrared spectral region.

As shown in FIG. 2, the light-emitting device 1 comprises a substrate 10 on which the light-emitting structure 12 is bonded. The substrate 10 is different from the growth substrate on which the light-emitting structure 12 is originally grown. Specifically, the light-emitting structure 12 is firstly epitaxially grown on the growth substrate, and is then separated from the growth substrate after the light-emitting structure 12 is bonded to the substrate 10 in order to get better light extraction efficiency, thermal conductivity, mechanical stability, or other considerations. In one embodiment, the growth substrate is removed by laser lift-off or etching after the light-emitting structure 12 is bonded to the substrate 10 by a bonding layer 14. The substrate 10 can be an insulated substrate, such as sapphire or glass, or a conductive substrate comprising metal material, such as Mo, W, Cu, Al, or an alloy thereof, or semiconductor material, such as Si or Ge. When the substrate 10 is configured to be an insulated substrate, the material of the bonding layer 14 preferably comprises a transparent insulating material, such as polymer, nitride, or oxide, or comprises a transparent conductive material, such as metal oxide. When the substrate 10 is configured to be an electrically conductive substrate, the material of the bonding layer 14 preferably comprises an electrically conductive material such as metal, metal alloy, or metal oxide. In one example of the embodiment, the substrate 10 is bonded to the light-emitting structure 12 by the bonding layer 14 at a temperature lower than 500° C., or perfectly lower than 200° C. Specifically, the material of the bonding layer 14 comprises metal or metal alloy, such as Au, In, Ti, Pt, Sn, Ni, AuSn alloy, InAu alloy, or NiAu alloy.

As shown in FIG. 1 and FIG. 2, the light-emitting device 1 comprises a first electrode 16 having one or more pad portions 161, a first extension portion 163, and a plurality of second extension portions 162, formed on a first side of the light-emitting structure 12; a transparent structure 15 formed on a second side of the light-emitting structure 12, wherein the transparent structure 15 is aligned to a region where the first electrode 16 is formed; a contact structure 13 comprising a plurality of contact dots 131 provided to surround the transparent structure 15 and ohmically contacting the light-emitting structure 12; a conductive layer 17 covering the transparent structure 15 and the contact structure 13; and a second electrode 18 formed on a bottom surface of the substrate 10. The transparent structure 15 is formed in a pattern corresponding to a pattern of the first electrode 16. Specifically, the transparent structure 15 comprises a wider width than the electrode 16 when taking a cross section along line X-X' of FIG. 1. The transparent structure 15 comprises a first transparent layer 151 and a second transparent layer 152 formed around the first transparent layer 151. Specifically, the second transparent layer 152 is formed around an outer periphery of the first transparent layer 151. More specifically, the first transparent layer 151 and the second transparent layer 152 both contact the light-emitting structure 12. The region where the first transparent layer 151 contacts the light-emitting structure 12 is larger than the region where the second transparent layer 152 contacts the light-emitting structure 12 such that the adhesion between the light-emitting structure 12 and the transparent structure 15 is increased. In order to improve the light extraction efficiency of the light-emitting device 1, an interface formed between the light-emitting structure 12 and the first transparent layer 151 comprises a textured rough surface. The first transparent layer 151 comprises a first base 1511 close to the light-emitting structure 12 and a second base 1513 away from the light-emitting structure 12. The first transparent layer 151 further comprises an sidewall 1512 between the first base 1511 and the second base 1513 for reflecting the light emitted from the light-emitting structure 12. The sidewall 1512 of the first transparent layer 151 is inclined to the second side of the light-emitting structure 12 by an angle θ between 20° and 80°, preferably between 25° and 50°. Specifically, the cross sectional shape of the first transparent layer 151 comprises trapezoid with a wider base close to the light-emitting structure 12 and a narrower base opposite to the wider base.

The circumference of the first base 1511 of the first transparent layer 151 substantially surrounds an outer periphery of the first electrode 16 from a top view of the light-emitting device 1. The second base 1513 of the first transparent layer 151 comprises a width equal to or larger than a width of the first electrode 16 from a top view of the light-emitting device 1. A ratio between the thickness of the first transparent layer 151 and the thickness of the second transparent layer 152 preferably ranges from 5 to 20, such that the second transparent layer 152 is conformably formed on the first transparent layer 151.

The material of the first transparent layer 151 comprises an insulating material or a conductive material. The conductive material of the first transparent layer 151 comprises metal oxide material, such as zinc oxide, indium tin oxide (ITO), or indium zinc oxide (IZO). The insulating material of the first transparent layer 151 comprises dielectric material, such as $SiO_x$, $SiN_x$, $Ta_2O_5$, or $SiO_xN_y$, or organic material, such as epoxy. The material of the second transparent layer 152 comprises an insulating material. The insulating material of the second transparent layer 152 comprises dielectric material, such as $MgF_x$, or organic material, such as silicone, or BCB. The first transparent layer 151 and the second transparent layer 152 have different refractive indices from one another. Preferably, the refractive index of the first transparent layer 151 is higher than that of the second transparent layer 152, but lower than that of the first semiconductor layer 121. For example, the refractive index of the first transparent layer 151 is between 1.5 and 3.0 and preferably between 1.7 and 2.8, the refractive index of the second transparent layer 152 is between 1.0 and 2.0 and preferably lower than 1.5. According to Snell's law, the critical angle ($θ_c$) is a function of the ratio of refractive indices between materials, as the difference of refractive indices between the light-emitting structure 12 and the first transparent layer 151 increases, the light from the light-emitting structure to be transmitted into the first transparent layer 151 decreases, and the light is more likely to be reflected at the interface between the light-emitting structure 12 and the first transparent layer 151 at an angle greater than the critical angle ($θ_c$).

As shown in FIG. 1, the transparent structure 15 has a continuous contour substantially encompassing the contour of the first electrode 16 from a top view of the light-emitting device 1. As shown in FIG. 2, the transparent structure 15 acting as current blocking is disposed directly under the first electrode 16 and overlaps or aligns to the first electrode 16 from a top view of the light-emitting device 1. The light being reflected at the interface between the light-emitting structure 12 and the first transparent layer 151 may be reflected back towards the first electrode 16 and further be absorbed by the first electrode 16. In order to reduce the light absorption by the first electrode 16, the difference of refractive indices between the light-emitting structure 12 and the first transparent layer 151 is smaller than 1.7, preferably smaller than 1.5, more preferably smaller than 1.3, and the difference of refractive indices between the first transparent layer 151 and the second transparent layer 152 is greater than 0.4, preferably greater than 0.6, more preferably greater than 0.8, for increasing the light to be transmitted into the first transparent layer 151 and then deflected or scattered by the inclined sidewall 1512 of the first transparent layer 151. The inclined sidewall 1512 guides the light from the light-emitting structure 12 to be deflected to a direction away the first electrode 16, therefore the light extraction efficiency of the light-emitting device 1 is increased. The thickness of the first transparent layer 151 or the second transparent layer 152 is proportional to λ/4n, "n" is the refractive index of the first transparent layer 151 or the second transparent layer 152, λ is the dominant wavelength of the light emitted from the light-emitting structure 12. Preferably, the first transparent layer 151 comprises a thickness thicker than a thickness of the second transparent layer 152. The thickness of the second transparent layer 152 is preferably greater than 300 angstroms and lower than 2000 angstroms. The thickness of the first transparent layer 151 is preferably 5 to 20 times that of the second transparent layer 152.

As shown in FIG. 2, the contact structure 13 comprises the plurality of contact dots 131 provided to correspond to a region beyond the first electrode 16. The contact structure 13 is spaced apart from the transparent structure 15 and a portion of the first semiconductor layer 121 is exposed. The conductive layer 17 is conformably formed on the transparent structure 15 and the contact structure 13, and extended into the region where the first semiconductor layer 121 is exposed to contact with the light-emitting structure 12. In other words, the conductive layer 17 is formed on the contact structure 13 and the transparent structure 15, and between the contact structure 13 and the transparent structure 15. The material of the contact dot 131 comprises metal, transparent conductive metal oxide, semiconductor, or the combination thereof. The contact structure 13 can be formed with single layer or multiple layers. In an example of the embodiment, the contact structure 13 is formed with single layer composed of metal. In another example of the embodiment, the contact structure 13 is formed with multiple layers, and one layer of the multiple layers closest to the light-emitting structure 12 comprises heavily doped semiconductor material, specifically, the contact structure 13 comprises a semiconductor layer having a doping concentration greater than $10^{18}$ $cm^{-3}$ in directly and ohmically contacting with the first semiconductor layer 121. The semiconductor layer of the contact structure 13 comprises the same or different material as that of the first semiconductor layer 121 of the light-emitting structure 12. Moreover, the semiconductor layer of the contact structure 13 comprises the same conductivity type as that of the first semiconductor layer 121 of the light-emitting structure 12. In the case of the conductive layer 17 being capable of forming an ohmic contact with the first semiconductor layer 121, the contact structure 13 is optionally absent from the present embodiment.

Figure 3:
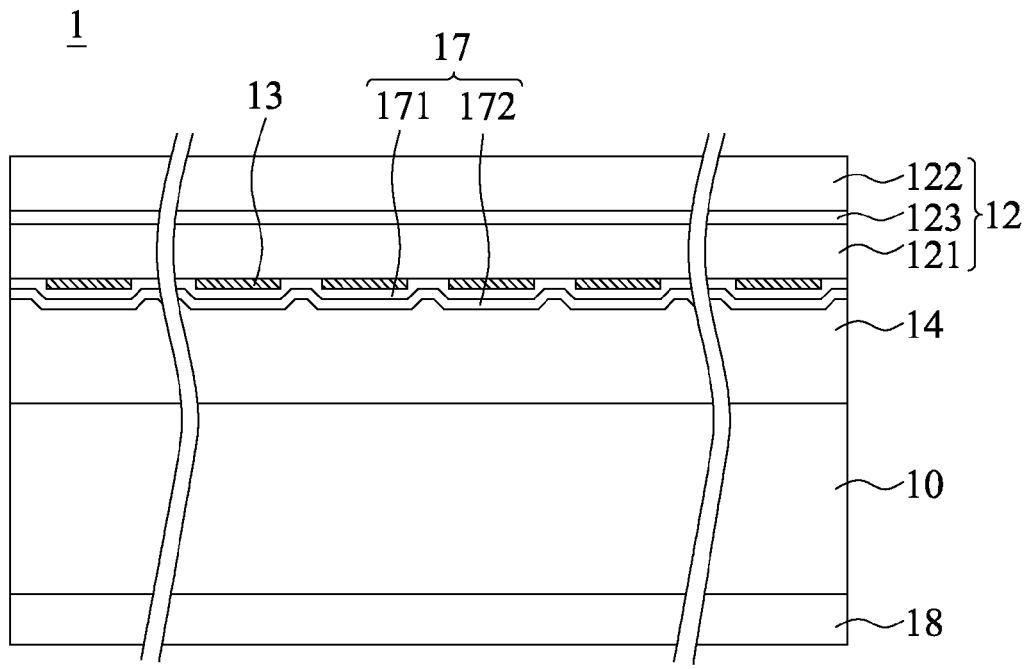
FIG. 3 shows a cross-sectional view of a light-emitting device along line Y-Y' of FIG. 1.

FIG. 3 shows a cross-sectional view of the light-emitting device 1 along line Y-Y' of FIG. 1. The contact structure 13 comprises the plurality of contact dots 131 spaced apart from each other. The conductive layer 17 conformably covers the plurality of contact dots 131 and contacts the light-emitting structure 12.

As shown in FIG. 2, the first electrode 16 and the second electrode 18 are formed on opposite sides of the light-emitting structure 12. The first electrode 16 is formed on a side of the light-emitting structure 12 opposite to a side of the light-emitting structure 12 where the transparent structure 15 is formed on. The contact structure 13 and the first electrode 16 are not overlapped from a top view of the light-emitting device 1 to avoid of current crowding as shown in FIG. 1. The contact structure 13 is provided to correspond to a region beyond the first electrode 16. The first electrode 16 or the second electrode 18 comprises metal material, such as Au, Al, Pt, Cr, Ti, Ni, W, and the combination thereof. As shown in FIG. 1, the first electrode 16 comprises the one or more pad portions 161, the first extension portion 163 extending along a first direction, and the plurality of second extension portions 162 extending along a second direction perpendicular to the first direction. Specifically, the first extension portion 163 intersects the one or more pad portions 161 and the second extension portions 162. The one or more pad portions 161 are arranged on a first side of the light-emitting structure 12. The plurality of second extension portions 162 extend from the first side to a second side opposite to the first side for uniformly spreading electrical current over the light-emitting structure 12. The plurality of second extension portions 162 is arranged in a form of straight lines parallel to each other. Specifically, the first electrode 16 comprises a plurality of pad portions 161 formed along the first side of the light-emitting device 1 and separated from each other. The first extension portion 163 interconnects the plurality of pad portions 161. The pad portions 161 are formed between two outmost second extension portions 162 and respectively intersect two inner second extension portions 162. Specifically, one of the pad portions 161 is formed between two adjacent second extension portions 162, one of the two adjacent second extension portions 162 is closer to the pad portion 161 than the other one of the two adjacent second extension portions 162. The plurality of contact dots 131 of the contact structure 13 is evenly distributed between two of the plurality of second extension portions 162 of the first electrode 16 from a top view of the light-emitting device 1.

Figure 4:
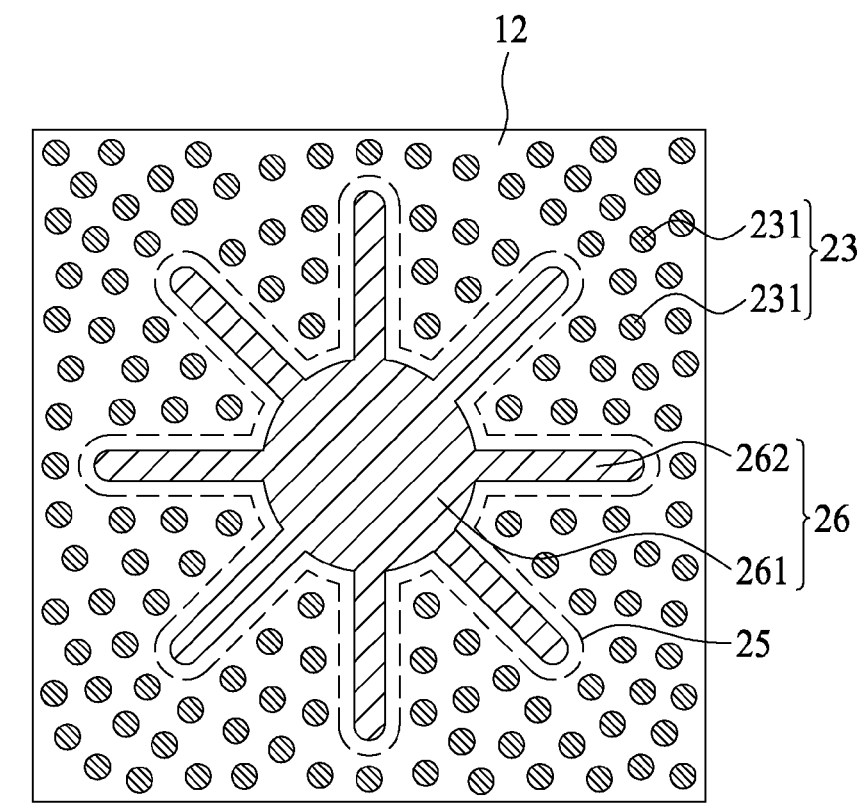
FIG. 4 shows a top view of a light-emitting device in accordance with a second embodiment of the present disclosure.

FIG. 4 shows a top view of a light-emitting device in accordance with a second embodiment of the present disclosure. The transparent structure 25 comprises the same or similar disclosure as the transparent structure 15 of the first embodiment except that the top-view pattern of the transparent structure 25 is different from that of the transparent structure 15 of the first embodiment. The first electrode 26 comprises a pad portion 261 and a plurality of extension portions 262. The pad portion 162 is arranged on center of the light-emitting structure 12 from a top view of the light-emitting device 2, and the plurality of extension portions 162 radiate from the pad portion 261 towards edges of the light-emitting device 2. A plurality of contact dots 231 of the contact structure 23 is formed around the first electrode 26 from a top view of the light-emitting device 2. It should be noted that the structures using the same name in the various embodiments of the present disclosure, except otherwise described, has the same or similar physical or chemical characteristics and performs the same or similar function. For example, the contact structure 23 comprising the same or similar disclosure, except the top-view pattern, as the contact structure 13 of the first embodiment.

The conductive layer 17 can be formed with a single layer or multiple sub-layers. In an example of the embodiment, the conductive layer 17 is formed with multiple sub-layers as shown in FIG. 2. The conductive layer 17 comprises a transparent conductive layer 171 and a reflective layer 172. In another embodiment, the transparent conductive layer 171 is a single layer comprising an electrically conductive material, such as indium tin oxide (ITO), indium oxide, tin oxide, zinc oxide, indium zinc oxide (IZO). The reflective layer 172 comprises a metal material, such as Ag, Al, Au, and has a reflectivity higher than 80% with respect to the light emitted from the light-emitting structure 12. The light emitted from the light-emitting structure 12 is reflected by the reflective layer 172, and majorly exits from a top surface of the light-emitting device 1.

In an example of the embodiment, the bonding layer 14 comprises a void. The forming position of the void corresponds to a position of the contact dot 131 from a cross sectional view of the light-emitting device 1.

Figure 5:
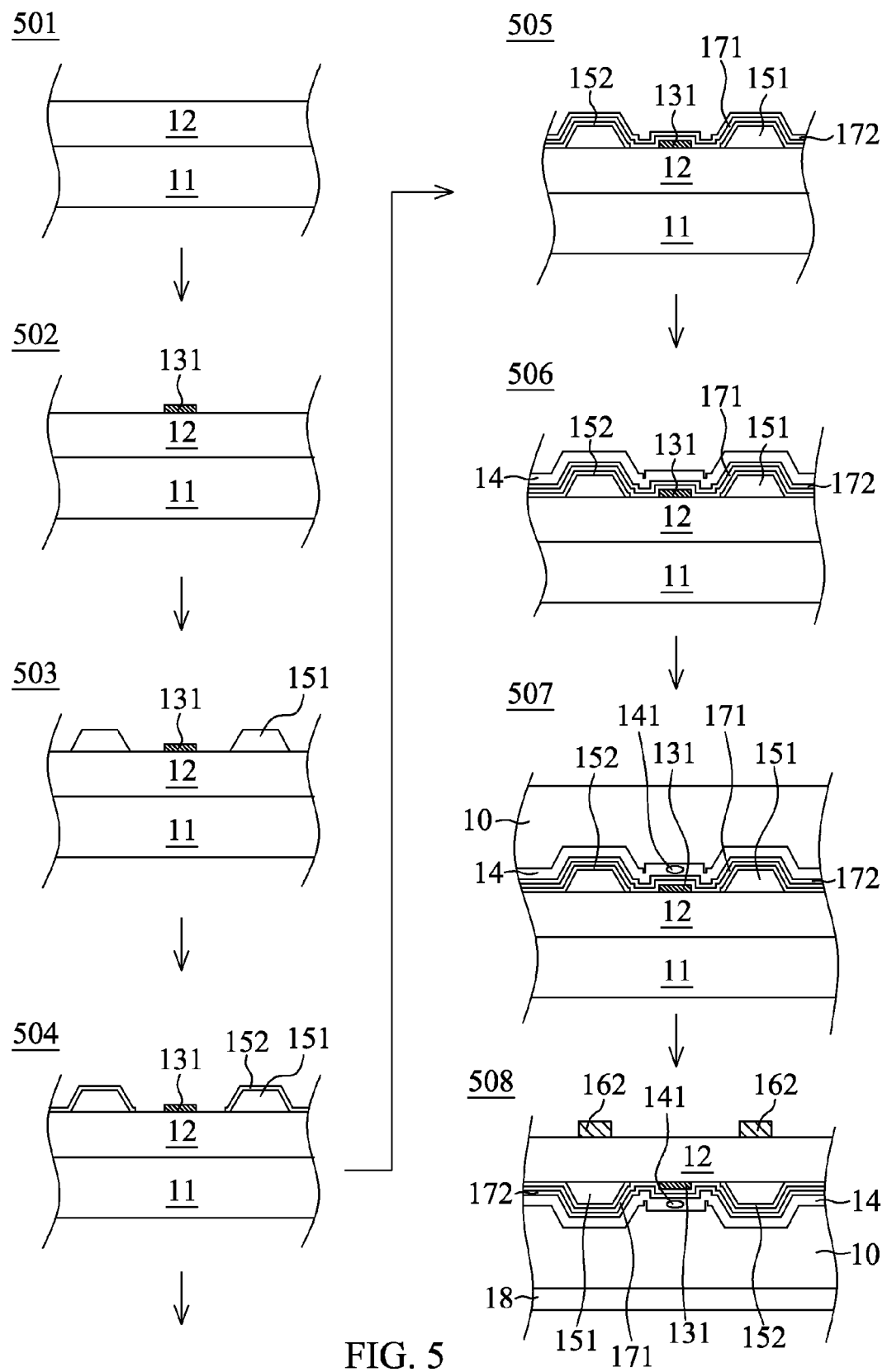
FIG. 5 shows a process flow of a manufacturing method of a light-emitting device in accordance with an embodiment of the present disclosure.

FIG. 5 shows a manufacturing method of the light-emitting device 1 in accordance with the first embodiment of the present disclosure. First, in step 501, the light-emitting structure 12 is formed on the growth substrate 11. Next, in step 502, the contact structure comprising the plurality of contact dots 131 is formed on the light-emitting structure 12. Next, in step 503, the first transparent layer 151 is formed on the light-emitting structure 12, and the first transparent layer 151 is provided with a pattern and spaced apart from the contact dot 131. A dielectric layer is conformably formed on the first transparent layer 151 and the contact dot 131. Then the dielectric layer is patterned to form the second transparent layer 152, which conforms to a shape of the first transparent layer 151. The second transparent layer 152 is spaced apart from the contact structure 13. Next, in step 505, the transparent conductive layer 171 and/or the reflective layer 172 is conformably formed on the second transparent layer 152 and the contact dots 131. In step 506, the bonding layer 14 is formed on the metal layer 17. In step 507, the substrate 10 is bonded to the light-emitting structure 12 by the bonding layer 14, and then the growth substrate 11 can be removed. In an example of the step 507, one or more voids 141 may be formed in the bonding layer 14 or between the substrate 10 and the bonding layer 14. Finally, in step 508, the first electrode 16 and the second electrode 18 are respectively formed on opposite sides of the light-emitting structure 12, wherein the first electrode 16 and the first transparent layer 151 comprises the same shape from a top view of the light-emitting device 1.

The first transparent structure 151, the second transparent structure 152, the plurality of contact structures 13, and the conductive layer 17 can be formed by evaporation, sputtering, chemical plating, or electroplating. Moreover, the growth substrate can be removed by laser or chemical process, such as wet etching or dry etching.

It will be apparent to those having ordinary skill in the art that various modifications and variations can be made in accordance with the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A light-emitting device, comprising:
   a light-emitting structure capable of emitting a light;
   an electrode formed on a first side of the light-emitting structure;
   a transparent dielectric structure formed on a second side of the light-emitting structure, wherein the transparent dielectric structure is aligned to a region of the electrode, and comprises a first transparent layer and a second transparent layer covering the first transparent layer, wherein the first transparent layer and the second transparent layer have different refractive indices; and
   a reflective layer covering the transparent dielectric structure.

2. The light-emitting device of claim 1, wherein the first transparent layer and the second transparent layer both contact the light-emitting structure.

3. The light-emitting device of claim 1, wherein a region where the first transparent layer contacts the light-emitting structure is larger than a region where the second transparent layer contacts the light-emitting structure.

4. The light-emitting device of claim 1, wherein the transparent dielectric structure is formed in a pattern corresponding to a pattern of the electrode.

5. The light-emitting device of claim 1, wherein the transparent dielectric structure comprises a wider width than the electrode.

6. The light-emitting device of claim 1, wherein the first transparent layer has a taper sidewall.

7. The light-emitting device of claim 1, wherein a sidewall of the first transparent layer is inclined to the second side of the light-emitting structure by an angle between 20 and 80°.

8. The light-emitting device of claim 1, wherein a cross sectional shape of the first transparent layer comprises trapezoid.

9. The light-emitting device of claim 1, wherein the first transparent layer comprises a thickness proportional to a quarter of a dominant wavelength of the light and inversely proportional to a refractive index of the first transparent layer.

10. The light-emitting device of claim 1, wherein the refractive index of the first transparent layer is between 1.5 and 3, and the refractive index of the second transparent layer is lower than 1.5.

11. The light-emitting device of claim 1, wherein an interface between the light-emitting structure and the transparent dielectric structure comprises a rough surface.

12. The light-emitting device of claim 1, wherein the reflective layer comprises a reflectivity higher than 80% with respect to the light emitted from the light-emitting structure.

13. The light-emitting device of claim 1, further comprising a bonding layer and a substrate, wherein the substrate is bonded to the reflective layer by the bonding layer.

14. The light-emitting device of claim 13, wherein a void is formed within the bonding layer or between the bonding layer and the substrate.

15. The light-emitting device of claim 1, wherein a contact structure is formed on the second side of the light-emitting structure.

16. The light-emitting device of claim 15, further comprising a transparent conductive layer covering the transparent dielectric structure and the contact structure, wherein the transparent conductive layer extends into a space between the contact structure and the transparent dielectric structure.

17. The light-emitting device of claim 15, wherein the contact structure is provided to correspond to a region beyond the electrode.

18. The light-emitting device of claim 1, wherein the first transparent layer comprises a thickness thicker than a thickness of the second transparent layer.

19. The light-emitting device of claim 18, wherein a ratio between the thickness of the first transparent layer and the thickness of the second transparent layer ranges from 5 to 20.

20. The light-emitting device of claim 1, wherein the refractive index of the first transparent layer is higher than that of the second transparent layer.

* * * * *